United States Patent [19]

Anantha et al.

[11] Patent Number: 4,691,435
[45] Date of Patent: Sep. 8, 1987

[54] METHOD FOR MAKING SCHOTTKY DIODE HAVING LIMITED AREA SELF-ALIGNED GUARD RING

[75] Inventors: Narasipur G. Anantha, Hopewell Junction; Harsaran S. Bhatia; Santosh P. Gaur, both of Wappingers Falls, all of N.Y.; John L. Mauer, IV, South Kent, Conn.

[73] Assignee: International Business Machines Corporation, Armonk, N.Y.

[21] Appl. No.: 263,227

[22] Filed: May 13, 1981

[51] Int. Cl.[4] .......................................... H01L 21/385
[52] U.S. Cl. ...................................... 437/175; 437/162; 437/233
[58] Field of Search ................ 148/187, 188, 1.5; 29/591, 578

[56] References Cited

U.S. PATENT DOCUMENTS

| | | | |
|---|---|---|---|
| 3,907,617 | 9/1975 | Zwernemann | 148/188 |
| 4,038,107 | 7/1977 | Marr et al. | 148/1.5 |
| 4,063,964 | 12/1977 | Peressini et al. | 148/1.5 |
| 4,209,349 | 6/1980 | Ho et al. | 148/1.5 X |
| 4,209,350 | 6/1980 | Ho et al. | 148/188 |
| 4,256,514 | 3/1981 | Pogge | 148/1.5 |
| 4,356,623 | 11/1982 | Hunter | 148/188 X |

OTHER PUBLICATIONS

S. U. Kim, "A Very Small Schottky Barrier Diode (SBD) With Self-Aligned Guard Ring for VLSI Applications", Dec. 1979, IEEE Proceedings, p. 49.
N. G. Anantha et al., "Schottky Barrier Diode With Polycrystalline Silicon Guard Ring", Dec. 1978, IBM Technical Disclosure Bulletin, vol. 21, No. 7, p. 2752.

Primary Examiner—George T. Ozaki
Attorney, Agent, or Firm—T. Rao Coca; Robert J. Haase

[57] ABSTRACT

A method is disclosed for fabricating a small area, self aligned guard ring in a Schottky barrier diode. A vertically-walled hole is anisotropically etched completely through a dielectric layer on a silicon substrate. A layer of doped polycrystalline silicon is deposited over the apertured dielectric layer. The polycrystalline silicon is reactively ion etched away to leave only a lining about the perimeter of the hole in the dielectric layer. The structure is heated to diffuse the dopant from the lining into the substrate. Schottky diode metal is deposited on the substrate exposed through the lined aperture in the dielectric layer.

13 Claims, 5 Drawing Figures

METHOD FOR MAKING SCHOTTKY DIODE HAVING LIMITED AREA SELF-ALIGNED GUARD RING

BACKGROUND OF THE INVENTION

1. Field of the Invention

The invention generally relates to self-aligned guard ring Schottky diodes and, more particularly, to such diodes wherein the area of the guard ring is reduced to a very accurately controlled minimum.

2. Description of the Prior Art

A self-aligned Schottky barrier diode guard ring which uses a minimum of the device area has been desired for many years. Various techniques have been proposed but leave unsolved the problem of very accurately controlling the minimized surface area of the guard ring in order that reproducible diode characteristics can be achieved. One technique is shown in U.S. Pat. 4,063,964 for "Method for Forming a Self-Aligned Schottky Barrier Device Guardring", issued Dec. 20, 1977 in the names of Peressini et al. and assigned to the assignee of the present invention. Said patent relies on the heat induced shrinkage of a metal silicide Schottky barrier-forming metal to delineate the area of a subsequently diffused guard ring. In the paper "A Very Small Schottky Barrier Diode (SBD) With Self-Aligned Guard Ring for VLSI Applications" by Sang U. Kim published in the December, 1979 IEEE Proceedings, p. 49, the area of the guard ring depends upon the extent of lateral undercut of nitride-oxide layers which, in turn, depends upon the etching time of the underlying oxide layer. Neither technique provides optimum area control whereby the smallest area self-optimum aligned guard rings are achieved in a reproducible manner. The IBM ® Technical Disclosure Bulletin, Vol. 21, No. 7, December 1978, pg. 2752 describes a technique for using a boron-doped polysilicon ring for diffusing the guard ring area of a Schottky diode but the polysilicon ring is determined photolithographically and is not of minimum area.

Defensive Publication T. 101,201, entitled Method For Making Stable Nitride-Defined Schottky Barrier Diodes, filed Apr. 14, 1941 (Ser. No. 254,039) as a continuation of Ser. No. 133,064, filed Mar. 24, 1980, now abandoned Anantha et al, and assigned to the present assignee, discloses a Schottky diode having no guard ring but which employs an undoped polycrystalline silicon ring which is formed about an isotropically etched hole in nitride-oxide layers, the oxide layer being undercut relative to the nitride layer. The purpose of the ring is to eliminate the "mousehole" (or undercut region) in the oxide prior to placing a Schottky contact inside the ring and on the underlying silicon substrate. The thickness of the polycrystalline ring must be sufficient to fill in the undercut region of the oxide, the dimensions of which can not be closely controlled. If the ring, contrary to the teaching of said copending patent application, had been doped so as to form a guard ring, the area of the guard ring would likewise not be closely controllable.

SUMMARY OF THE INVENTION

A guard ring Schottky diode and a method for fabricating same in which a self-aligned guard ring of minimum area is centered about a Schottky contact made to a silicon substrate. A substantially vertically walled hole is anisotropically etched completely through a layer of dielectric material on a silicon substrate. Doped polycrystalline silicon is deposited over the apertured dielectric material and into the hole, the thickness of said polycrystalline silicon being controlled in accordance with the area desired for the guard ring. The deposited polycrystalline is anisotropically etched to remove it from all nonvertical surfaces of the structure and to expose the substrate through the apertured dielectric layer. The remaining structure is heated so as to diffuse the dopant from the deposited polycrystalline silicon into the substrate to form the guard ring. Schottky diode metal is deposited on the substrate exposed through the apertured dielectric layer.

DESCRIPTION OF THE PREFERRED EMBODIMENT

In a guard ring Schottky Diode, forward current increases as the area of the guard ring increases. That is, the p-n junction of the ring conducts at a lower forward voltage as the ring area increases. Additionally, charge storage effects in the p-n junction of the ring increase with ring area, and slow down the maximum attainable switching speed. Only the direct current reverse diode characteristic is not adversely affected by ring size. Thus, smaller ring size is desirable in view of the foregoing considerations as well as the fact that greater circuit density is facilitated thereby for large scale integration purposes.

Provision is made, according to the present invention, for achieving minimum guard ring size, below presently attainable diffusion mask opening sizes, by the utilization of anisotropic etching and doped polycrystalline silicon deposition techniques.

Figure 1:
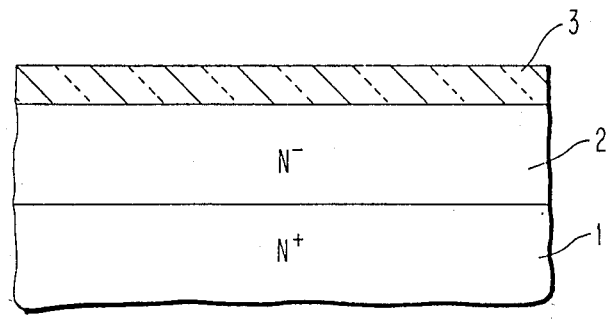
FIGS. 1-4 are a series of cross-sectional views of a preferred embodiment of the invention showing the structure resulting at successive times during the course of fabrication.

Starting with N+ substrate 1 of FIG. 1 of about 0.001Ωcm silicon material, N- epitaxial layer 2, of about 0.3Ωcm silicon material, is deposited to a thickness of about 1 micrometer. Epitaxial layer 2 is covered with a dielectric material such as thermally grown silicon dioxide layer 3 to a thickness preferably in the range of about 2000Å to about 5000Å. The SiO$_2$ layer 3, in turn, is covered by a photoresist (not shown), for example, approximately 1 micrometer thickness of resist. The photoresist is exposed and developed in those areas where Schottky diode contacts are desired to be located.

Using the patterned photoresist as a mask, the SiO$_2$ layer 3 is anisotropically etched, as by reactive ion etching, to produce substantially vertically-walled holes in SiO$_2$ layer 3 where Schottky diode contacts are desired. Then, as shown in FIG. 2, p+ doped polycrystalline silicon layer 4 is deposited to a thickness preferably in the range from about 2500Å to about 3000Å.

The thickness of polysilicon layer 4 is closely controlled as it will determine the a self-aligned guard ring to be formed in epitaxial layer 2 after further processing. The processing includes the reactive ion etching and dopant drive-in techniques disclosed in U.S. Pat. No. 4,209,350, issued June 24, 1980 to Ho et al. for Method For Forming Diffusions Having Narrow Dimensions Utilizing Reactive Ion Etching and assigned to the present assignee.

Figure 2:
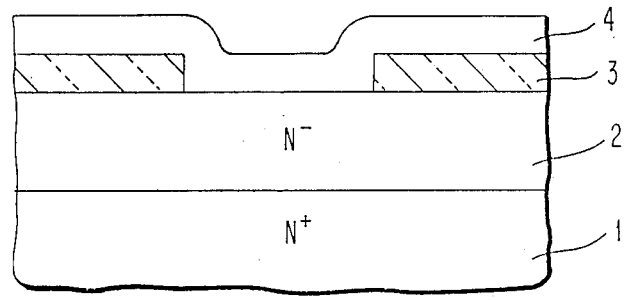
Figure 3:
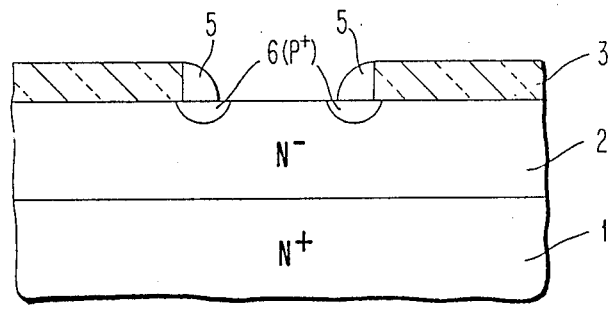

The reactive ion etching of doped polysilicon layer 4 removes said layer from all horizontal surfaces of the structure of FIG. 2 and has no effect on the substantially vertical surfaces. The result is to leave doped polycrystalline silicon only along the substantially vertical surfaces of the edges of the hole in SiO$_2$ layer 3 shown in FIG. 3. The resulting structure is heated at a suitable temperature and time, such as at about 1000° C. for about 1 hour, to cause the dopant in polysilicon sidewall 5 to diffuse into epitaxial layer 2 to form guard ring 6. The Schottky diode is completed by deposition of suitable metal 7 of FIG. 4 such as the group comprising PtSi, Pt, Pd, Al and Mo (for high barrier diodes). If a low barrier diode is required, a metal such as Ti, Ta, Hf, Cr or Ti-W may be used as the Schottky contact metal.

Figure 5:
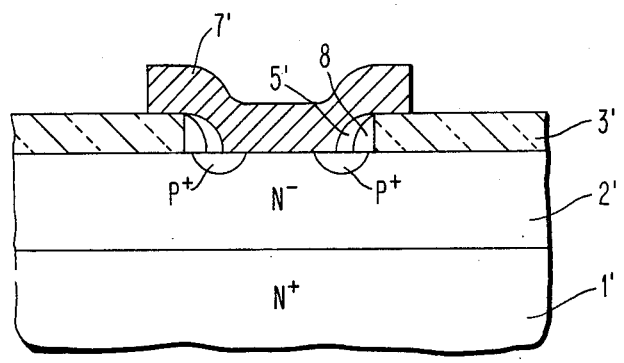
FIG. 5 is a cross-sectional view of an alternative embodiment.

Provision is made in another species of the present invention shown in FIG. 5 for reducing the size of the resultant guard ring Schottky diode so as to occupy only a portion of the hole originally etched through SiO$_2$ layer 3. In this manner, the resolution limitations of the photolithography, which masked SiO$_2$ layer 3 against etching, can be avoided where a minimum sized Schottky diode and guard ring are required. The fabrication process initially is the same as described in connection with FIG. 1. After SiO$_2$ layer 3 is apertured, however, another layer of SiO$_2$ is chemically vapor deposited and is reactively ion etched to leave only sidewall portion 8 which partially fills in the hole originally etched in SiO$_2$ layer 3. The structure then is completed as described before, i.e., a layer of doped polycrystalline silicon is deposited and reactively ion etched to leave only sidewall portion 5′, the dopant is driven into the epi 3′ by annealing and an appropriate Schottky contact metal 7′ is deposited.

Figure 4:
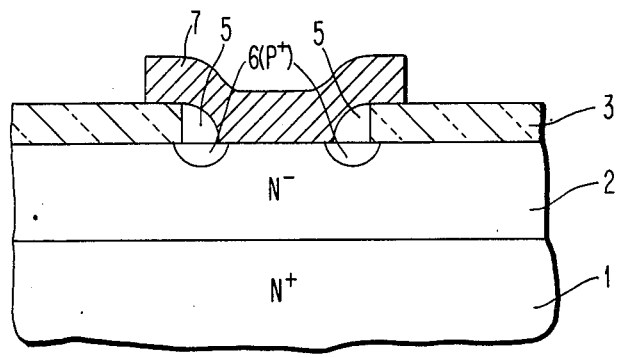

It has been found that the minimum thickness or width W of the doped sidewall portion 5 and 5′ of FIGS. 4 and 5, respectively, should be of the order of about 1000Å so the resultant guard ring is of sufficient area to reduce the electric field at the corners of the Schottky diode contact to acceptable levels. The maximum width of the total sidewall portions is limited by the thickness of the SiO$_2$ layer 3. Therefore, the thickness of the SiO$_2$ layer 3 in the single sidewall case of FIG. 4 generally should be greater than 1000Å but need not be greater than about 3000Å while the SiO$_2$ layer 3′ thickness in the double sidewall case of FIG. 5 generally need not be greater than about 5000Å. The dopant concentration in the doped sidewall portion should be at least one order of magnitude greater than the dopant concentration in the underlying epitaxial layer.

We claim:

1. The method for making a self-aligned guard ring Schottky barrier diode comprising
    depositing a dielectric layer on a silicon substrate, anisotropically etching said dielectric layer to produce a substantially vertically walled hole therein,
    depositing a doped silicon layer over said etched dielectric layer,
    reactively ion etching said silicon layer anisotropically to expose said substrate through said hole in said etched dielectric layer,
    heating said substrate and said doped silicon layer so as to diffuse the dopant from said silicon layer into said substrate, and
    depositing Schottky diode metal onto said exposed substrate.

2. The method defined in claim 1 wherein said silicon substrate is formed by depositing an epitaxial layer of lighter doping concentration on a substrate of heavier doping concentration, and
    said dielectric layer is deposited on said epitaxial layer.

3. The method defined in claim 2 wherein the step of depositing a doped silicon layer over said etched dielectric layer comprises
    depositing a second dielectric layer over said etched dielectric layer and reactively ion etching said second dielectric layer anisotropically to expose said substrate through said hole in said etched dielectric layer, said doped silicon layer being deposited over said etched second dielectric layer.

4. A method of manufacturing a Schottky Barrier diode comprising:
    forming an insulating layer on the surface of a semiconductor substrate of a first conductivity type;
    forming a first opening in said insulating layer, partly exposing the surface of said substrate;
    forming a continuous semiconductor layer doped with an impurity of a second conductivity type opposite to said first conductivity type over said insulating layer and on said exposed substrate surface in said first opening;
    etching said doped semiconductor layer in the direction of thickness thereof until those portions which lie on the insulating layer and the exposed surface of the substrate are removed to provide as a diffusion source a portion of said doped semiconductor layer remaining on the side wall of said insulating layer which defines said first opening and also form a second opening partly exposing said semiconductor substrate surface within said first opening;
    causing diffusion of said impurity from said diffusion source into said semiconductor substrate to form a guard ring region therein; and
    forming a metal layer on said exposed semiconductor substrate surface within said second opening, said metal layer forming a Schottky barrier with said semiconductor substrate.

5. A method according to claim 4, wherein said doped semiconductor layer is formed directly on said insulating layer and in said first opening, and is anisotropically etched to provide said diffusion source and make said second opening.

6. A method according to any one of claims 4 and 5, wherein said substrate is formed of silicon.

7. A method according to claim 6, wherein said insulating layer is formed of silicon oxide.

8. A method of making contact to a face of a semiconductor body through an aperture in an insulating layer of said face, comprising the steps of:
    (a) depositing a layer of conductive material on said face to cover the semiconductor body within said aperture and also to cover the insulating layer and the sidewalls of the aperture,
    (b) selectively removing said layer of conductive material from said face over said insulating layer but leaving said layer in place on said sidewalls,
    (c) thereafter depositing additional conductive material on said face to extend continuously from above the insulator and down the sidewall into the aperture and to make physical and electrical contact to the semiconductor body in said aperture.

9. A method according to claim 8 wherein the step of removing the layer of conductive material includes a vertical orientation-dependent etching.

10. A method of applying a conductive strip to a face of a body having a vertical step, comprising the steps of:
  (a) depositing a layer of conductive material on said face to cover the body and the sidewall of the step,
  (b) selectively removing the layer of conductive material over all of said face by anisotropic etch but leaving a segment of the layer on the sidewall, and
  (c) thereafter depositing another layer of conductive material on all of said face to extend across the step and said segment making physical contact to said face.

11. A method according to claim 10 wherein the body is semiconductor.

12. A method of making a metal connection at a face of a semiconductor body, said connection extending over a step in an insulating layer on said face, comprising the steps of:
  (a) depositing a layer of conductive material on said face to cover said face of the semiconductor body and to cover the insulating layer and the sidewall of the step,
  (b) selectively removing the layer of conductive material over said insulating layer but leaving the layer on said sidewall, and
  (c) thereafter depositing another layer of conductive material on said face to extend continuously across the step over the sidewall to physically engage said face of the body.

13. A method according to claim 12 wherein the step of removing the layer of conductive material includes vertical anisotropic etching.

* * * * *